US006987291B2

(12) United States Patent
Abbott et al.

(10) Patent No.: US 6,987,291 B2
(45) Date of Patent: Jan. 17, 2006

(54) INTEGRATED TRANSISTOR CIRCUITRY

(75) Inventors: Todd R. Abbott, Boise, ID (US); Zhongze Wang, Boise, ID (US); Jigish D. Trivedi, Boise, ID (US); Chih-Chen Cho, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/236,282

(22) Filed: Sep. 5, 2002

(65) Prior Publication Data

US 2003/0015766 A1 Jan. 23, 2003

Related U.S. Application Data

(62) Division of application No. 09/713,844, filed on Nov. 15, 2000, now Pat. No. 6,599,789.

(51) Int. Cl.
*H01L 31/0328* (2006.01)

(52) U.S. Cl. ...................................... 257/192; 257/368
(58) Field of Classification Search ................ 257/192, 257/213, 368, 386
See application file for complete search history.

(56) References Cited

U.S. PATENT DOCUMENTS

| | | | |
|---|---|---|---|
| 5,308,782 A | 5/1994 | Mazure et al. | |
| 5,340,754 A | 8/1994 | Witek et al. | |
| 5,760,442 A | 6/1998 | Shigyo et al. | |
| 5,908,313 A | 6/1999 | Chau et al. | |
| 5,943,575 A | 8/1999 | Chung | |
| 5,972,758 A * | 10/1999 | Liang | 438/294 |
| 6,027,975 A | 2/2000 | Hergenrother et al. | |
| 6,156,589 A | 12/2000 | Noble | |
| 6,180,494 B1 | 1/2001 | Manning | |
| 6,229,187 B1 | 5/2001 | Ju | |
| 6,245,636 B1 | 6/2001 | Maszara | |
| 6,274,913 B1 | 8/2001 | Brigham et al. | |
| 6,300,199 B1 | 10/2001 | Reinberg | |
| 6,300,219 B1 | 10/2001 | Doan et al. | |
| 6,358,798 B1 | 3/2002 | Chen | |
| 6,376,286 B1 | 4/2002 | Ju | |
| 6,388,294 B1 | 5/2002 | Radens et al. | |
| 6,391,726 B1 | 5/2002 | Manning | |
| 6,424,011 B1 | 7/2002 | Assaderaghi et al. | |
| 6,465,852 B1 | 10/2002 | Ju | |
| 6,544,874 B2 | 4/2003 | Mandelman et al. | |
| 6,617,202 B2 | 9/2003 | Lee | |
| 6,649,460 B2 | 11/2003 | Leobandung | |
| 6,716,687 B2 | 4/2004 | Wang et al. | |

OTHER PUBLICATIONS

U.S. patent application Ser. No. 10/073,723, Wang et al., filed Feb. 11, 2002.
U.S. patent application Ser. No. 10/222,326, Tang et al., filed Aug. 15, 2002.
Wolf et al., *Silicon Epitaxial Film Growth*, 1 Silicon Processing for the VLSI Era—Process Technology, pp. 124–160 (Lattice Press 1986).

* cited by examiner

*Primary Examiner*—George Fourson
*Assistant Examiner*—Thanh Pham
(74) *Attorney, Agent, or Firm*—Wells St. John P.S.

(57) ABSTRACT

Integrated circuitry includes a bulk semiconductor substrate. A field effect transistor thereon includes a gate, a channel region in the bulk semiconductor substrate, and source/drain regions within the substrate on opposing sides of the channel region. A field isolation region is formed in the bulk semiconductor substrate and laterally adjoins with one of the source/drain regions. The field isolation region includes a portion which extends beneath at least some of the one source/drain region. Other aspects are contemplated.

21 Claims, 6 Drawing Sheets

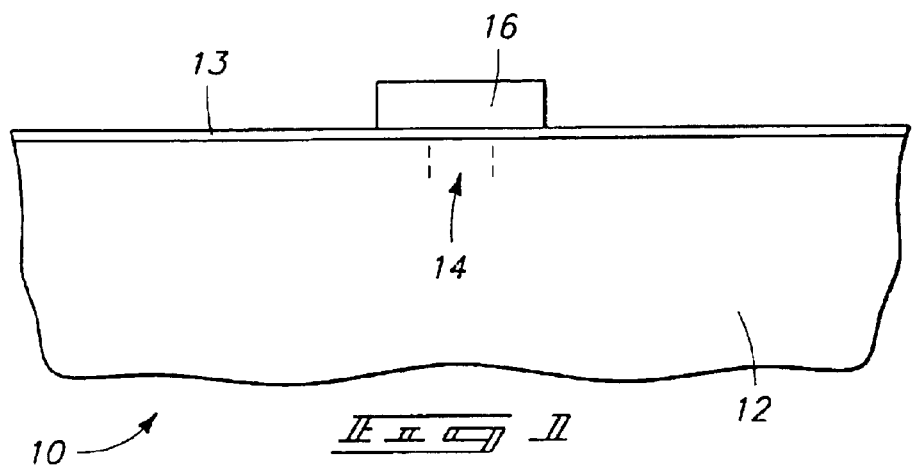
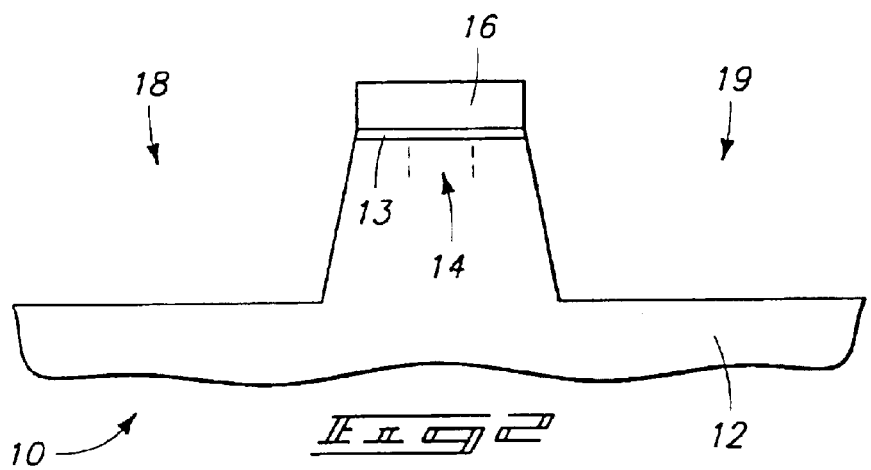
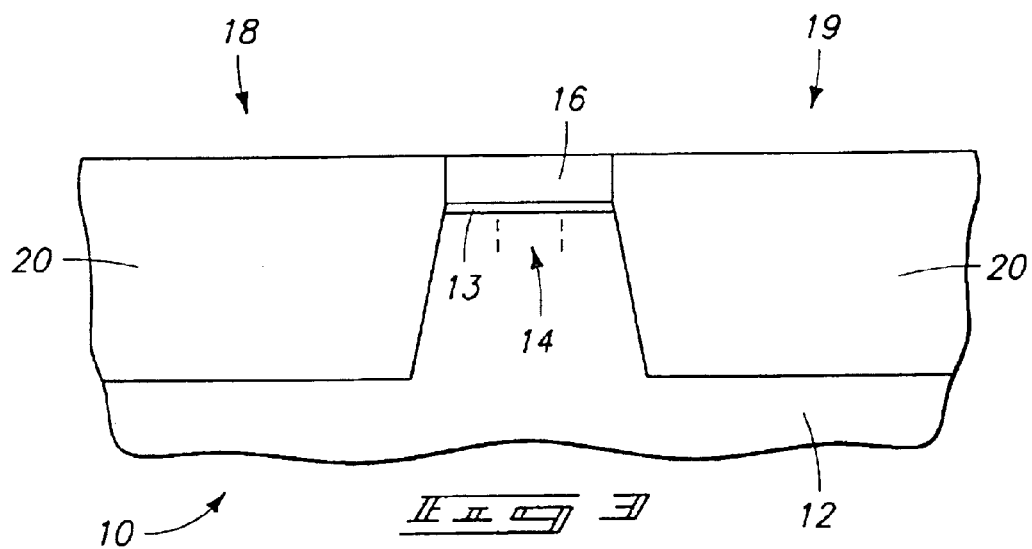

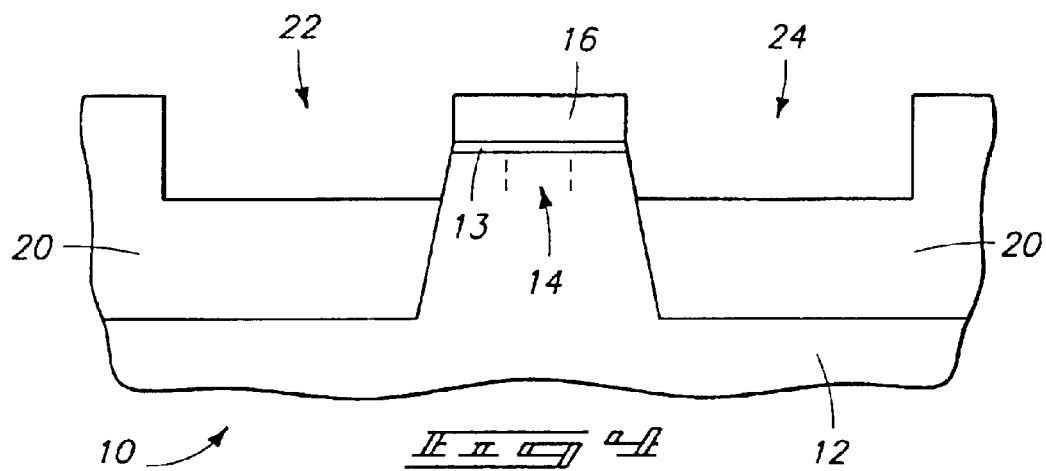
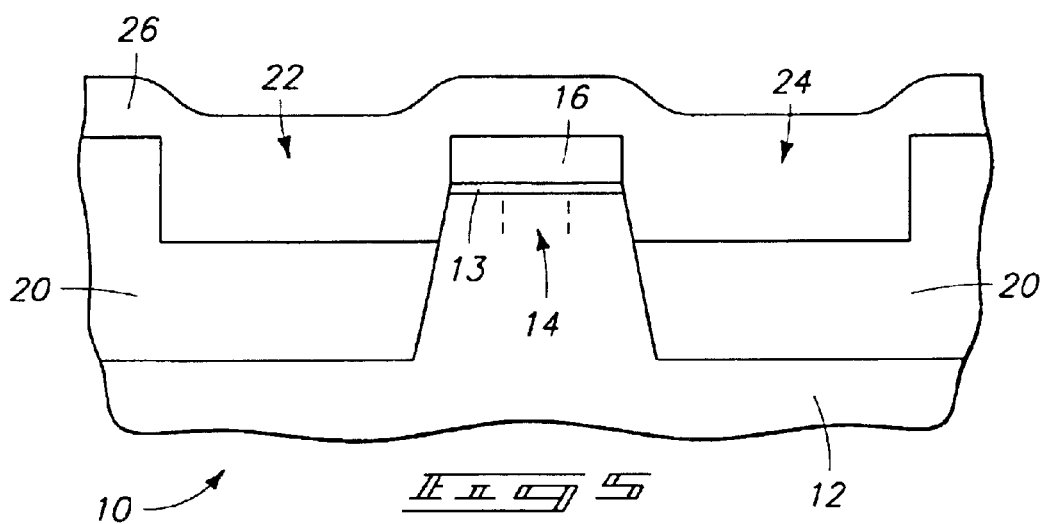
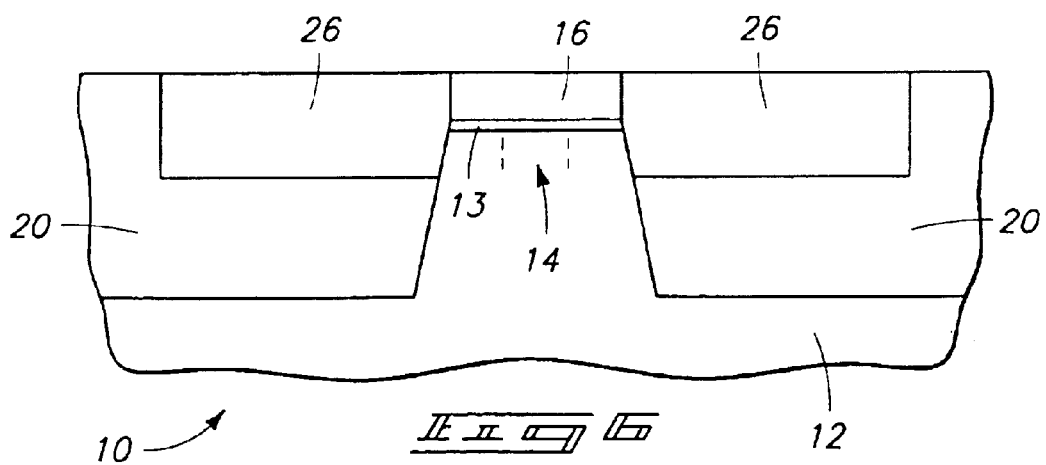

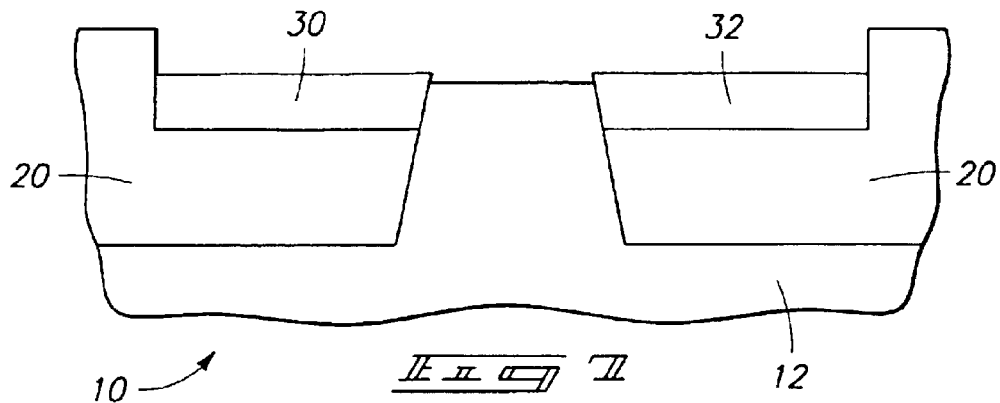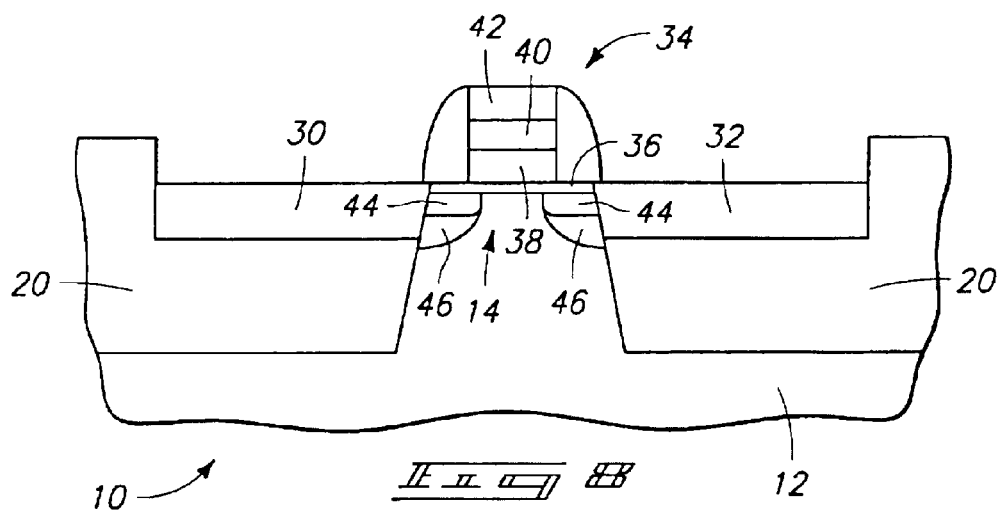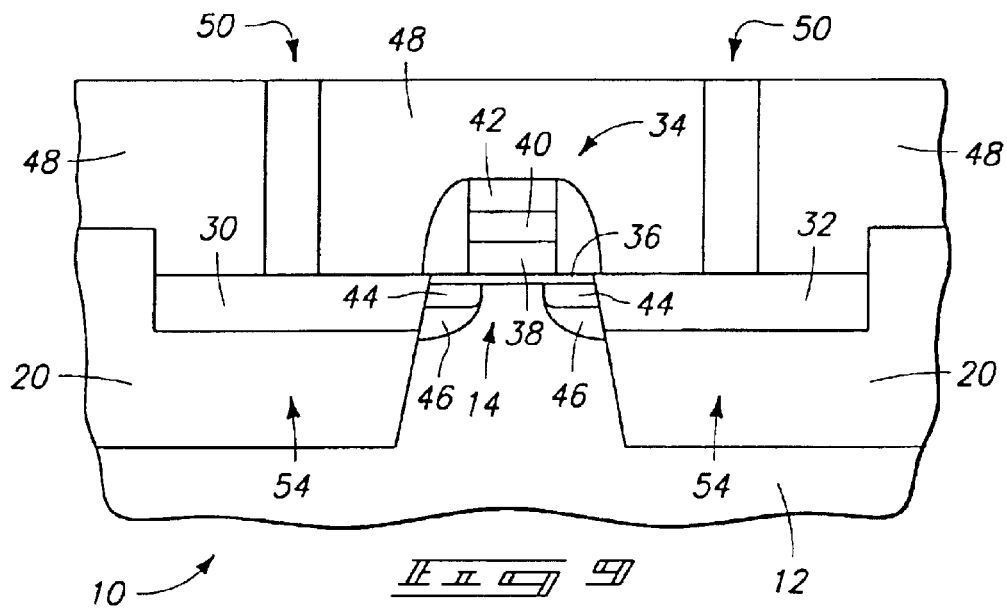

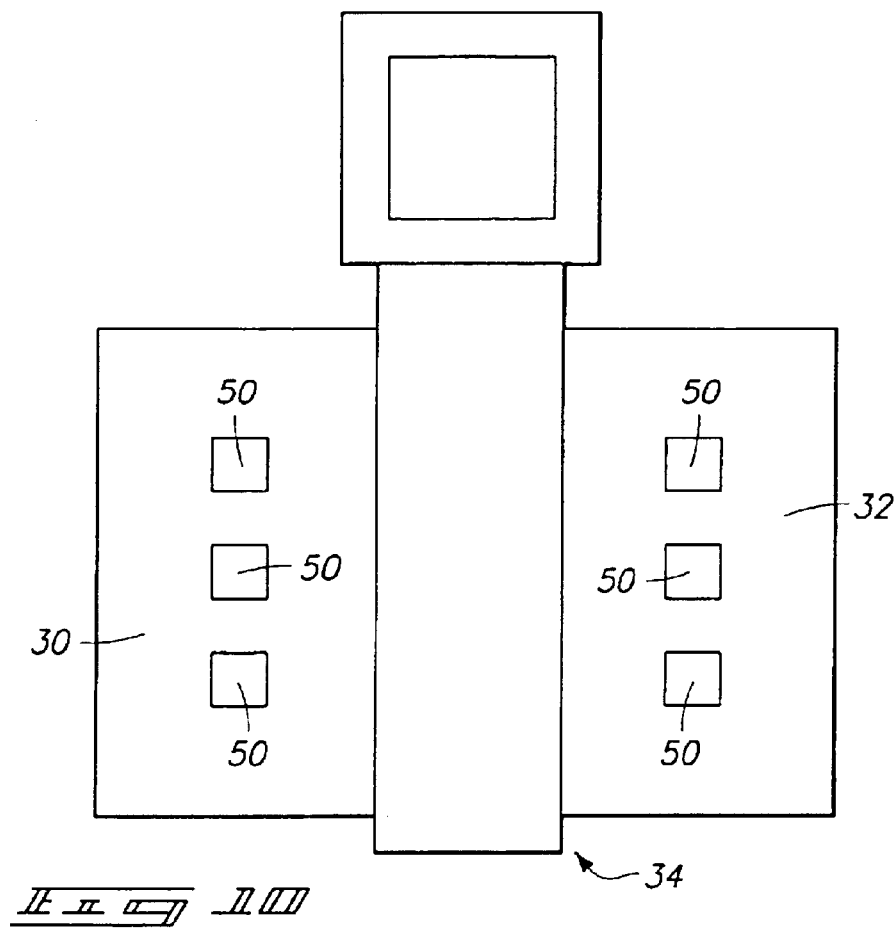
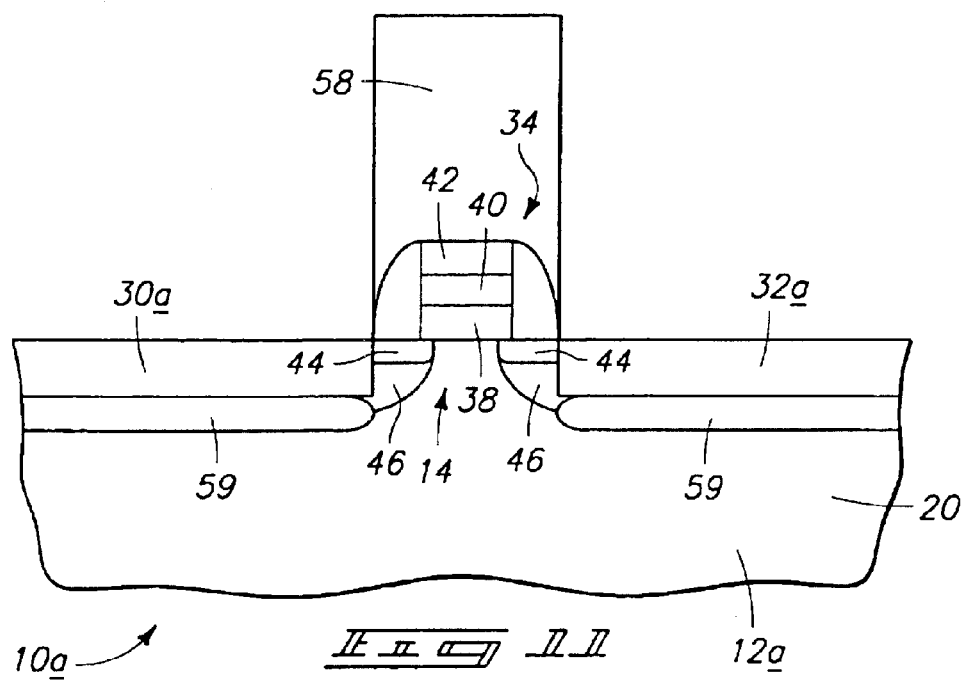

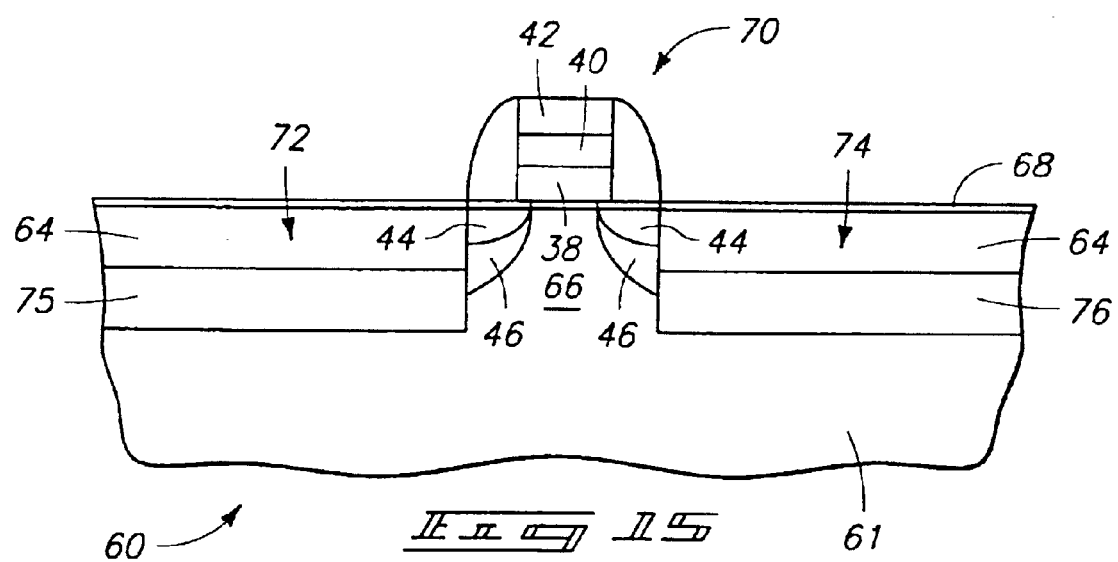

INTEGRATED TRANSISTOR CIRCUITRY

This patent resulted from a divisional application of U.S. patent application Ser. No. 09/713,844 filed Nov. 15, 2000, now U.S. Pat. No. 6,599,789, entitled "Method of Forming a Field Effect Transistor", naming Todd R. Abbott, Zhongze Wang, Jigish D. Trivedi and Chih-Chen Cho as inventors, now U.S. Pat. No. 6,599,798, the disclosure of which is incorporated by reference.

TECHNICAL FIELD

This invention relates to methods of forming field effect transistors, to methods of forming integrated circuitry, and to integrated circuitry.

BACKGROUND OF THE INVENTION

Semiconductor processors continue to strive to reduce the size of individual electronic components, thereby enabling smaller and denser integrated circuitry. One typical circuitry device is a field effect transistor. Such typically includes opposing semiconductive source/drain regions of one conductivity type having a semiconductive channel region of opposite conductivity type therebetween. A gate construction is received over the channel region. Current can be caused to flow between the source/drain regions through the channel region by applying a suitable voltage to the gate.

The channel region is in some cases composed of background doped bulk semiconductive substrate or well material, which is also received immediately beneath the opposite type doped source/drain regions. This results in a parasitic capacitance developing between the bulk substrate/well and the source/drain regions. This can adversely affect speed and device operation, and becomes an increasingly adverse factor as device dimensions continue to decrease.

The invention was principally motivated in overcoming problems associated with the above-identified parasitic capacitance in bulk field effect transistor devices. However, the invention is in no way so limited, nor limited to solving or reducing this or any other problem whether identified/ identifiable herein or elsewhere, with the invention only being limited by the accompanying claims as literally worded and as appropriately interpreted in accordance with the doctrine of equivalents.

SUMMARY

This invention includes methods of forming field effect transistors, methods of forming integrated circuitry, and integrated circuitry. In but one implementation, a method of forming a field effect transistor includes forming a channel region within bulk semiconductive material of a semiconductor substrate. Source/drain regions are formed on opposing sides of the channel region. An insulative dielectric region is formed within the bulk semiconductive material proximately beneath at least one of the source/drain regions.

In one implementation, a method of forming a field effect transistor includes providing a semiconductor-on-insulator substrate, said substrate comprising a layer of semiconductive material formed over a layer of insulative material. All of a portion of the semiconductive material layer and all of the insulative material layer directly beneath the portion are removed thereby creating a void in the semiconductive material layer and the insulative material layer. Semiconductive channel material is formed within the void. Opposing source/drain regions are provided laterally proximate the channel material. A gate is formed over the channel material.

In one implementation, integrated circuitry includes a bulk semiconductor substrate. A field effect transistor thereon includes a gate, a channel region in the bulk semiconductor substrate, and source/drain regions within the substrate on opposing sides of the channel region. A field isolation region is formed in the bulk semiconductor substrate and laterally adjoins with one of the source/drain regions. The field isolation region includes a portion which extends beneath at least some of the one source/drain region.

In one implementation, integrated circuitry includes a substrate having a field effect transistor formed thereon. The transistor includes a gate, a channel region, and source/drain regions on opposing sides of the channel region. First and second dielectric insulative material masses are received beneath and contact the source/drain regions. The dielectric insulative material masses do not extend to beneath the channel region.

BRIEF DESCRIPTION OF THE DRAWINGS

Preferred embodiments of the invention are described below with reference to the following accompanying drawings.

FIG. 1 is a diagrammatic sectional view of a semiconductor wafer fragment at one processing step in accordance with an aspect of the invention.

FIG. 2 is a view of the FIG. 1 wafer at a processing step subsequent to that shown by FIG. 1.

FIG. 3 is a view of the FIG. 1 wafer at a processing step subsequent to that shown by FIG. 2.

FIG. 4 is a view of the FIG. 1 wafer at a processing step subsequent to that shown by FIG. 3.

FIG. 5 is a view of the FIG. 1 wafer at a processing step subsequent to that shown by FIG. 4.

FIG. 6 is a view of the FIG. 1 wafer at a processing step subsequent to that shown by FIG. 5.

FIG. 7 is a view of the FIG. 1 wafer at a processing step subsequent to that shown by FIG. 6.

FIG. 8 is a view of the FIG. 1 wafer at a processing step subsequent to that shown by FIG. 7.

FIG. 9 is a view of the FIG. 1 wafer at a processing step subsequent to that shown by FIG. 8.

FIG. 10 is a diagrammatic top view of the FIG. 9 wafer.

FIG. 11 is a diagrammatic sectional view of an alternate embodiment semiconductor wafer fragment in accordance with an aspect of the invention.

FIG. 15 is a view of the FIG. 12 wafer at a processing step subsequent to that shown by FIG. 14.

DETAILED DESCRIPTION OF THE PREFERRED EMBODIMENTS

Figure 12:
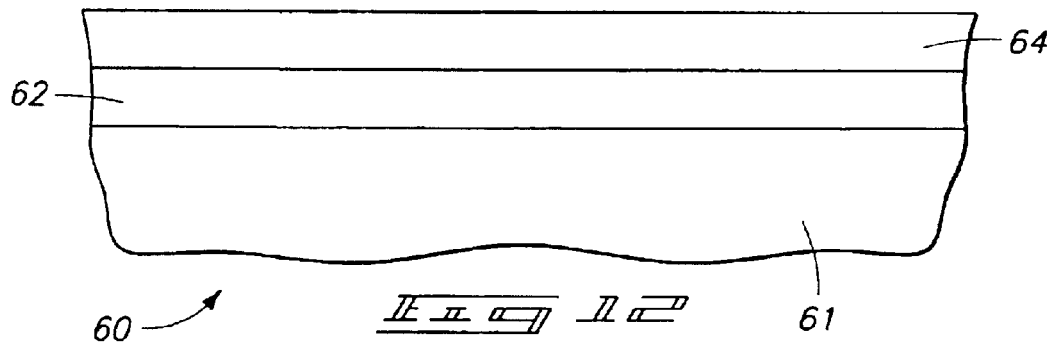
FIG. 12. is a diagrammatic sectional view of still another alternate embodiment semiconductor wafer fragment at a processing step in accordance with an aspect of the invention.

This disclosure of the invention is submitted in furtherance of the constitutional purposes of the U.S. Patent Laws "to promote the progress of science and useful arts" (Article 1, Section 8).

A method of forming integrated circuitry, including a field effect transistor, is initially described in but only some aspects of the invention in connection with FIGS. 1–10. Referring initially to FIG. 1, a semiconductor substrate is indicated generally with reference 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document unless otherwise indicated, the term "layer" includes the singular and the plural.

Substrate 10 comprises a bulk semiconductor substrate 12. An example preferred material is monocrystalline, such as monocrystalline silicon lightly doped with p-type material. In the context of this document, the term "bulk" also includes doped well regions within such substrates. Bulk substrate 12 comprises a channel region 14 which is shown as being masked by a pad oxide layer 13 and a patterned block of masking material 16. For an exemplary 0.15 micron transistor gate width, an exemplary thickness for layer 13 is 100 Angstroms. An exemplary preferred material for mask 16 is silicon nitride deposited to an exemplary thickness of 900 Angstroms. An example width is 0.25 micron. In the illustrated and preferred embodiment, masking material 16 extends laterally beyond the lateral confines of channel region 14. Such provides but one example of forming a channel region within bulk semiconductive material of a semiconductor substrate, and of masking the same.

Referring to FIG. 2, at least one trench is formed into the bulk semiconductor substrate on at least one side of the channel region received within the bulk semiconductor substrate. Preferably and as shown, two trenches 18, 19 are formed into bulk semiconductor substrate 12 on opposing sides of masked channel region 14. Such preferably occurs by any existing or yet-to-be developed substantially anisotropic etching technique. An exemplary preferred depth for the trench etching is 2500 Angstroms.

Referring to FIG. 3, an insulative dielectric material 20 is deposited over masking material 16 and to within and overfilling trenches 18 and 19. Exemplary and preferred processing includes sidewall oxidation either before or after deposition of layer 20. An example and preferred material for layer 20 is high-density plasma deposited oxide. The insulative dielectric material is preferably initially deposited to overfill the trenches and then subsequently planarized at least to masking material 16 to provide the preferred illustrated FIG. 3 construction. Example planarizing techniques include chemical-mechanical polishing and etch back.

Referring to FIG. 4, portions of insulative dielectric material 20 are removed from within trenches 18 and 19 effective to form at least one, and preferably two as shown, source/drain voids 22 and 24 on the respective sides of channel region 14. Such removal as shown is also preferably effective to expose bulk semiconductive material 12. An example preferred depth of voids 22 and 24 within insulative dielectric material 20 is 1700 Angstroms. The preferred removal technique is a timed anisotropic etch, and with a photolithographic patterned mask being received over the non-etched portions of layer 20. In the preferred embodiment, such effectively defines the outlines of the source/drains of the transistor(s) being formed. Preferably and as shown, such removing forms an outer surface of insulative dielectric material 20 to be planar at the base of such voids 22 and 24.

Referring to FIG. 5, source/drain semiconductive material 26 is formed within source/drain voids 22 and 24. Material 26 in but one embodiment comprises monocrystalline material (by way of example only via epitaxial silicon growth), and in but another embodiment comprises polycrystalline material, and in but another embodiment a mixture of monocrystalline and polycrystalline. An exemplary preferred material is polycrystalline silicon, preferably in situ conductively doped with an n-type conductivity enhancing impurity during a chemical vapor deposition. Accordingly, in the preferred embodiment, source/drain material 26 covers and physically contacts the previously exposed bulk semiconductor substrate material 12.

Referring to FIG. 6, deposited material 26 is planarized at least to masking material 16. Example and preferred techniques include chemical-mechanical polishing and etch back.

Referring to FIG. 7, channel region 14 is unmasked preferably by etching away all of the masking material 16 and all of pad oxide layer 13. Further preferably as shown, some and only some of semiconductive material 26 is etched from the substrate. Such might occur in a single or more etching step(s) depending on the chemistry utilized and the desires of the processor, as readily determinable by the artisan. By way of example only, an example etch chemistry which will etch polysilicon and silicon nitride in a substantially nonselective manner includes plasma $CF_4$, $CH_2F_2$ and He. In the subject example, the preferred amount of semiconductive material left is 900 Angstroms thick. Such provides but one example of forming source/drain regions 30 and 32 on opposing sides of channel region 14. The upper surface of channel region 14 in FIG. 7 is preferably approximately 200 Angstroms beneath the upper surfaces of regions 30 and 32, which are also preferably substantially planar.

Referring to FIG. 8, a gate 34 is formed over channel region 14. Preferably as shown, a gate dielectric layer 36, for example silicon dioxide, is first formed over channel region 14. A gate stack is then formed thereover, preferably comprising a conductively doped polysilicon layer 38 and a conductive silicide layer 40 (for example $WSi_x$) and a nitride capping layer 42. Thereafter, at least one pocket implanting is conducted to provide at least one pocket implant region intermediate source/drain semiconductive material 26 and channel region 14. In the illustrated and preferred example, exemplary pocket implants include source/drain extension (SDE) implant regions 44 having a thickness of 500 Angstroms, and halo implant regions 46 provided therebeneath having an approximate thickness of 500 Angstroms and to extend below source/drain regions 30, 32. Insulative spacers are subsequently added as shown. Rapid thermal processing is preferably conducted at some point, as is conventional.

Referring to FIGS. 9 and 10, subsequent exemplary processing is illustrated. Depicted is the provision and planarizing of an insulative dielectric layer 48, for example borophosphosilicate glass (BPSG). Contact openings have been formed therethrough and plugged with conductive material to form source/drain contacts 50.

The above-described embodiment provides but one example of providing an insulative dielectric region within bulk semiconductive material 12 proximately beneath at least one of the source/drain regions. Preferably and as shown, such insulative dielectric region is formed beneath both source/drain regions and physically contacts the subject source/drain regions. Further in the described and preferred embodiment, forming of the insulative dielectric region beneath the source/drain regions occurs prior to forming the source/drain regions, and includes at least some depositing of an insulative dielectric layer. Such preferred processing also depicts the formation of gate 34 after forming the source/drain semiconductive material.

Further, the illustrated construction provides but one example of novel integrated circuitry independent of the method of fabrication. Such comprises a bulk semiconductor substrate including a field effect transistor comprising a gate, a channel region in the bulk semiconductor substrate, and source/drain regions within the substrate on opposing sides of the channel region. At least one field isolation region is formed in the bulk semiconductor substrate and laterally adjoins with one of the source/drain regions. The field isolation region includes some portion 54 which extends beneath at least some of the source/drain region (FIG. 9). In the illustrated and preferred embodiment, the field isolation region portions 54 contact the source/drain regions therebeneath. Further preferably, field isolation region portion 54 extends beneath at least a majority of the one source/drain region and even more preferably extends beneath at least 90% of the source/drain regions. The illustrated example shows greater than 95% coverage by portions 54 beneath the source/drain regions. Further preferably and as shown, each field isolation region portion 54 extends beneath less than all of the source/drain region. Further, at least one pocket implant region is received intermediate the source/drain region and the channel region.

FIG. 11 illustrates but one exemplary alternate embodiment which includes forming the insulative dielectric region after forming the source/drain regions. Like numerals from the first-described embodiment are utilized where appropriate, with differences being indicated by the suffix "a" or with different numerals. Substrate 10*a* comprises source/drain regions 30*a* and 32*a* formed within a bulk monocrystalline silicon substrate 12*a*. An implant masking construction 58 is formed over gate 34. Substrate 10*a* is then subjected to a suitable ion implantation whereby material is ion implanted into bulk semiconductive substrate material 12*a* which is either insulative dielectric material or a material which reacts with the bulk semiconductor material to form an insulative dielectric material. FIG. 11 depicts regions 59 formed thereby. Such processing might occur either before or after forming source/drain regions 30*a* and 32*a*. An example implant would be of oxygen atoms, for example at a dose of $4 \times 10^{17}$ atoms or ions per cubic centimeter at a suitable energy to achieve desired depth, and preferably followed by an anneal.

Yet but one additional alternate embodiment of forming integrated circuitry, including the forming of a field effect transistor, is described with reference to FIGS. 12–15. FIG. 12 illustrates a semiconductor-on-insulator substrate 60. Such comprises, in the preferred example, a bulk monocrystalline silicon substrate wafer 61 having a layer 62 of insulative material formed thereover. An example material is silicon dioxide. A layer 64 of semiconductive material is formed over layer 62. An example preferred material for layer 64 is silicon, preferably elemental silicon, such as monocrystalline or polycrystalline silicon.

Figure 13:
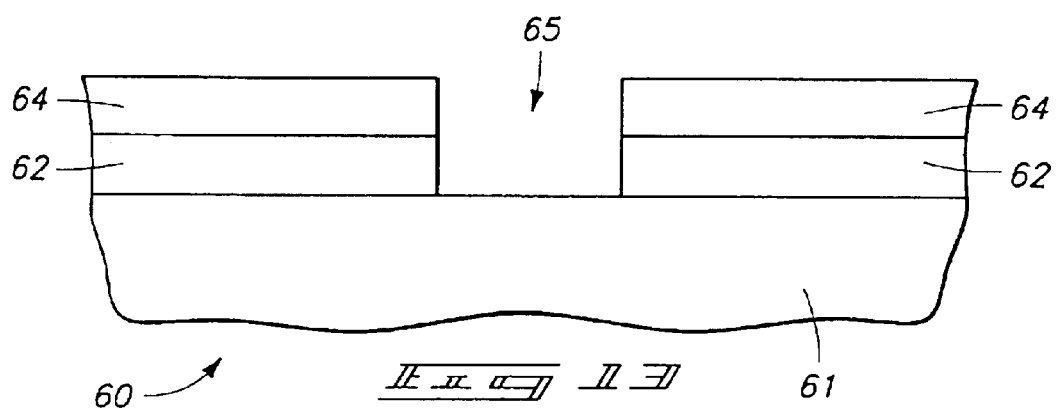
FIG. 13 is a view of the FIG. 12 wafer at a processing step subsequent to that shown by FIG. 12.

Referring to FIG. 13, all of a portion of semiconductive material layer 64 and all of insulative material layer 62 immediately therebeneath are removed, thereby creating a void 65 in semiconductive material layer 64. Such removing preferably occurs by photolithographic patterning of a masking layer and subsequent conventional or yet-to-be developed etching thereof. Such removing preferably exposes bulk monocrystalline silicon 61 of substrate 60 as shown.

Figure 14:
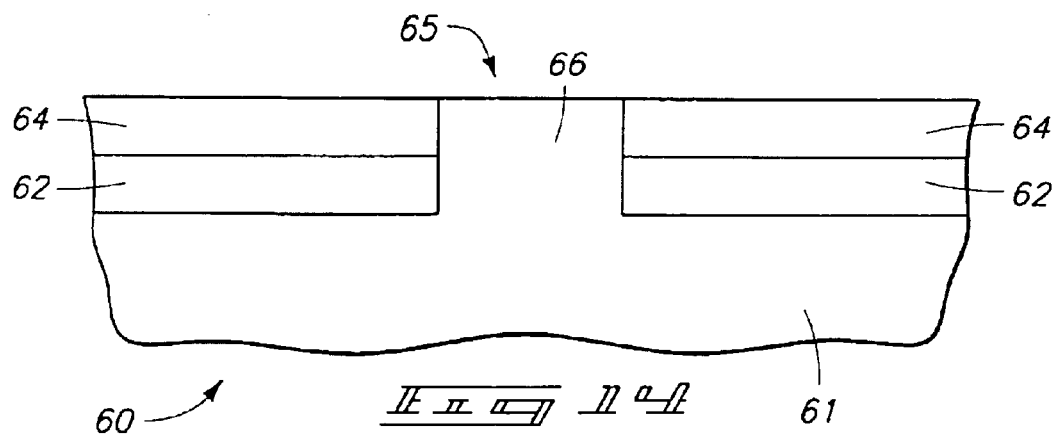
FIG. 14 is a view of the FIG. 12 wafer at a processing step subsequent to that shown by FIG. 13.

Referring to FIG. 14, semiconductive channel material 66 is formed within void 65. The example and preferred technique, where substrate material 61 comprises monocrystalline silicon, is conventional or yet-to-be-developed epitaxial silicon growth within void 65 from bulk monocrystalline silicon 61. Deposited polysilicon is but one alternate example.

Referring to FIG. 15, a gate dielectric layer 68 and a gate construction 70 are provided over channel material 66. Opposing source/drain regions 72 and 74 are provided laterally proximate channel material 66. As shown, such preferably constitute a portion of semiconductive material layer 64. Such might be formed by ion implantation or other doping with or without masking. Further, such doping might occur prior to forming gate 70, prior to forming semiconductive channel material 66 or prior to forming void 65. One example preferred process would be to dope semiconductor material layer 64 to a desired source/drain concentration prior to forming void 65, whereby the removing to form such void removes semiconductive material previously subjected to such doping.

Such provides but one exemplary alternate method embodiment, and as well depicts integrated circuitry construction in accordance with aspects of the invention independent of the method of fabrication. Such integrated circuitry comprises a substrate having a field effect transistor formed thereon. FIG. 15 illustrates dielectric insulative material masses 75 and 76 received beneath and contacting source/drain regions 72 and 74, with such dielectric insulative material masses not extending to beneath channel region 66. FIG. 9 also illustrates but one additional exemplary embodiment comprising first and second dielectric insulative material masses which are received beneath and contact source/drain regions, with such masses not extending to beneath the channel region.

By way of example only, one or more of the above embodiments may achieve one or more benefits. However, no one or combination of these benefits constitutes a requirement or subject matter of the accompanying claims. A first exemplary benefit includes reduction or essential elimination of junction capacitance beneath the source/drain regions, particularly in bulk semiconductor processing. Junction leakage is also reduced or effectively eliminated, preferably. Further with respect to bulk processing, junction capacitance can be significantly reduced compared to semiconductor-on-insulator processing. Further, the above-described processing can result in a reduction of short channel effects compared to other bulk semiconductor field effect transistor processing.

Another hopefully achieved advantage is improvement in active area isolation. Such can effectively occur by an essential lateral extension of the isolation region into what previously was a total bulk active area beneath the source/drain regions in bulk wafer processing.

Further, the above processing and structure can provide for reduction or elimination of floating body effects, which still can occur in fully depleted semiconductor-on-insulator structures. Further, the above processing can be used to fully integrate with borderless/low leakage contacts where the risk of over etch into underlying substrate can be effectively eliminated by the provision of the dielectric region immediately and contacting the source/drain junctions.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. Integrated circuitry comprising:
   a bulk semiconductor substrate comprising an upper surface, a lower surface, and a side extending from the upper surface to the lower surface, wherein the side is substantially planar;
   a field effect transistor gate elevationally above the upper surface;
   a channel region in the bulk semiconductor substrate and elevationally below the upper surface;
   a source/drain region elevationally above the lower surface and lateral of the channel region, wherein the side laterally adjoins at least a portion of the source/drain region; and
   a field isolation region formed below the upper surface and laterally adjoining with the source/drain region.

2. The integrated circuitry of claim 1 wherein the bulk semiconductor substrate comprises monocrystalline silicon.

3. The integrated circuitry of claim 1 wherein a portion of the field isolation region is below the source/drain region.

4. The integrated circuitry of claim 3 wherein the portion of the field isolation region contacts the source/drain region thereabove.

5. The integrated circuitry of claim 1 wherein the field isolation region adjoins the side of the semiconductor substrate.

6. The integrated circuitry of claim 1 further comprising at least one pocket implant region received intermediate the source/drain region and the channel region.

7. The integrated circuitry of claim 1 wherein the field isolation region comprises silicon dioxide.

8. The integrated circuitry of claim 1 wherein the source/drain region is polycrystalline and the channel region is monocrystalline.

9. The integrated circuitry of claim 1 wherein the source/drain region is monocrystalline and the channel region is monocrystalline.

10. The integrated circuitry of claim 1 wherein both the source/drain region and the channel region comprise crystalline elemental silicon.

11. The integrated circuitry of claim 1 wherein the side of the bulk semiconductor substrate laterally adjoins an entirety of a side of the source/drain region and an entirety of a side of the field isolation region.

12. The integrated circuitry of claim 1 wherein the side of the semiconductor substrate is tapered between the upper surface and the lower surface.

13. The integrated circuitry of claim 12 wherein the side of the bulk semiconductor substrate laterally adjoins both a side of the source/drain region and a side of the field isolation region.

14. The integrated circuitry of claim 13 wherein the side of the bulk semiconductor substrate adjoins an entirety of the side of the source/drain region and an entirety of the side of the field isolation region.

15. Integrated circuitry comprising:
    a bulk semiconductor substrate comprising a base and a pillar extending from the base, wherein the pillar comprises an upper surface and substantially planar sides extending from the upper surface to the base;
    a field effect transistor gate over the pillar;
    a channel region in the pillar and below the gate;
    source/drain regions adjoining opposing sides of the pillar; and
    first and second field isolation regions below the upper surface of the pillar, the first and second field isolation regions respectively laterally adjoining with the source/drain regions.

16. The integrated circuitry of claim 15 wherein the first and second field isolation regions are respectively below the source/drain regions.

17. The integrated circuitry of claim 16 wherein the field isolation regions contact the respective source/drain regions thereabove.

18. The integrated circuitry of claim 15 wherein the first and second field isolation regions adjoin the respective sides of the pillar.

19. The integrated circuitry of claim 15 wherein the sides of the pillar are tapered from the base to the upper surface.

20. The integrated circuitry of claim 19 wherein the first and second field isolation regions respectively adjoin the sides of the pillar.

21. The integrated circuitry of claim 20 wherein the field isolation regions and the source/drain regions respectively adjoin an entirety of the sides of the pillar.

* * * * *

UNITED STATES PATENT AND TRADEMARK OFFICE
CERTIFICATE OF CORRECTION

PATENT NO.        : 6,987,291 B2
APPLICATION NO. : 10/236282
DATED              : January 17, 2006
INVENTOR(S)       : Abbott et al.

It is certified that error appears in the above-identified patent and that said Letters Patent is hereby corrected as shown below:

Title page, Item (56) References Cited, U.S.PATENT DOCUMENTS, please insert --4,829,018   05/1989   Wahlstrom-- before "5,308,782".

Title page, Item (56) References Cited, U.S.PATENT DOCUMENTS, please insert --5,312,782   05/1994   Miyazawa--before "5,340,754".

Title page, Item (56) References Cited, U.S.PATENT DOCUMENTS, please insert --5,736,435   04/1998   Benkatesan et al.-- before "5,760,442".

Title page, Item (56) References Cited, U.S.PATENT DOCUMENTS, please insert --6,054,355   04/2000   Inumiya et al.-- before "6,156,589".

Title page, Item (56) References Cited, U.S.PATENT DOCUMENTS, please insert --6,174,754 B1   01/2001   Lee et al.-- before "6,180,494 B1".

Title page, Item (56) References Cited, U.S.PATENT DOCUMENTS, please insert --6,204,138 B1   03/2001   Krishnan et al.-- before "6,229,187 B1"

Title page, Item (56) References Cited, U.S.PATENT DOCUMENTS, please insert --6,261,878 B1   7/2001   Doyle-- before "6,274,913 B1".

Title page, Item (56) References Cited, U.S.PATENT DOCUMENTS, please insert --6,372,562 B1   4/2002   Matsumoto-- before "6,376,286 B1".

Title page, Item (56) References Cited, U.S.PATENT DOCUMENTS, please insert --6,420,767 B1   7/2002   Krishnan et al.-- before "6,424,011 B1".

Title page, Item (56) References Cited, U.S.PATENT DOCUMENTS, please insert --6,479,866 B1   11/2002   Xiang 6,514,809 B1   02/2003   Xiang-- before "6,544,874 B2".

UNITED STATES PATENT AND TRADEMARK OFFICE
CERTIFICATE OF CORRECTION

PATENT NO.       : 6,987,291 B2
APPLICATION NO. : 10/236282
DATED            : January 17, 2006
INVENTOR(S)      : Abbott et al.

It is certified that error appears in the above-identified patent and that said Letters Patent is hereby corrected as shown below:

Col. 1, line 5, please delete "now U.S. Pat. No. 6,599,789," before "entitled".

Signed and Sealed this

Fifteenth Day of May, 2007

JON W. DUDAS
*Director of the United States Patent and Trademark Office*